(12) United States Patent
Wang

(10) Patent No.: US 10,074,315 B2
(45) Date of Patent: Sep. 11, 2018

(54) SHIFT REGISTER UNIT, DRIVING METHOD, GATE DRIVING CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Bo Wang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

(*) Notice: Subject to any disclaimer, the term of this patent is extended or adjusted under 35 U.S.C. 154(b) by 0 days.

(21) Appl. No.: 15/539,124

(22) PCT Filed: May 23, 2016

(86) PCT No.: PCT/CN2016/082968
§ 371 (c)(1),
(2) Date: Jun. 22, 2017

(87) PCT Pub. No.: WO2017/148018
PCT Pub. Date: Sep. 8, 2017

(65) Prior Publication Data
US 2018/0082623 A1    Mar. 22, 2018

(30) Foreign Application Priority Data

Mar. 2, 2016  (CN) .......................... 2016 1 0119070

(51) Int. Cl.
*G09G 3/3266*   (2016.01)
*G09G 3/36*     (2006.01)
*G11C 19/28*    (2006.01)
*G11C 19/18*    (2006.01)

(52) U.S. Cl.
CPC ......... *G09G 3/3266* (2013.01); *G09G 3/3677* (2013.01); *G11C 19/184* (2013.01); *G11C 19/28* (2013.01); *G09G 2310/0286* (2013.01)

(58) Field of Classification Search
CPC .. G09G 3/3266; G09G 3/3674; G09G 3/3677; G09G 2310/0286; G11C 19/184; G11C 19/28
See application file for complete search history.

(56) References Cited

U.S. PATENT DOCUMENTS 9,653,179 B2 *  5/2017  Wu ......................... G11C 19/28
9,786,228 B2 * 10/2017  Ma ........................ G09G 3/3266
(Continued)

FOREIGN PATENT DOCUMENTS

CN  104809978 A  7/2015
CN  104900189 A  9/2015
(Continued)

OTHER PUBLICATIONS

Office Action in Chinese Application No. 201610119070.8 dated Sep. 25, 2017, with English translation.
(Continued)

*Primary Examiner* — Patrick O'Neill
(74) *Attorney, Agent, or Firm* — Womble Bond Dickinson (US) LLP

(57) ABSTRACT

A shift register unit, a driving method, a gate driving circuit and a display device are described. The shift register unit comprises a control circuit, a first output circuit and a second output circuit, wherein the first output circuit is connected with a first signal terminal, a first node and an output terminal, respectively; the second output circuit is connected with the output terminal, a second node, a first clock signal terminal and a second signal terminal, respectively; the control circuit is connected with the first node, the second (Continued)

node, the first signal terminal, the second signal terminal, the first clock signal terminal, a second clock signal terminal and an input terminal, respectively, and used for controlling the potentials of the first node and the second node.

16 Claims, 5 Drawing Sheets

(56) References Cited

U.S. PATENT DOCUMENTS

| | | | |
|---|---|---|---|
| 2008/0079682 A1 | 4/2008 | Chang et al. | |
| 2017/0193961 A1* | 7/2017 | Wang | G09G 5/003 |
| 2017/0330633 A1* | 11/2017 | Sun | G11C 19/186 |
| 2018/0090072 A1* | 3/2018 | Sun | G09G 3/3258 |

FOREIGN PATENT DOCUMENTS

| | | |
|---|---|---|
| CN | 104933990 A | 9/2015 |
| CN | 105096858 A | 11/2015 |
| CN | 105304013 A | 2/2016 |
| CN | 205950536 U | 2/2016 |
| CN | 105513531 A | 4/2016 |

OTHER PUBLICATIONS

International Search Report and Written Opinion in PCT/CN2016/082968 dated Nov. 18, 2016, with English translation.

* cited by examiner

SHIFT REGISTER UNIT, DRIVING METHOD, GATE DRIVING CIRCUIT AND DISPLAY DEVICE

RELATED APPLICATIONS

The present application is the U.S. national phase entry of PCT/CN2016/082968, with an international filing date of May 23, 2016, which claims the benefit of Chinese Patent Application No. 201610119070.8, filed on Mar. 2, 2016, the entire disclosures of which are incorporated herein by reference.

FIELD

The disclosure relates to the field of display technology, and in particular, to a shift register unit, a driving method, a gate driving circuit and a display device.

BACKGROUND

When displaying an image, a display device needs to utilize a shift register to scan pixel units. A shift register comprises multiple shift register units, and each of the shift register units corresponds to a row of pixel units. The multiple shift register units implement progressive scan driving of the pixel units of a display device to display an image.

As the number of pixels increases, the number of rows which the shift register (a gate switch circuit) needs to scan in a frame of time increases, which requires that the layout area of a shift register unit be less and its circuit structure be simpler. Generally, a shift register unit controls the size of the potential of the output signal of the circuit by multiple transistors and capacitors. However, in such a case, the circuit structure of each of the shift register units is relatively complex, and the control process is relatively cumbersome.

SUMMARY

Embodiments of the disclosure provide a shift register unit, a driving method, a gate driving circuit and a display device.

According to a first aspect of the disclosure, there is provided a shift register unit comprising a control circuit, a first output circuit and a second output circuit, wherein the first output circuit is connected with a first signal terminal, a first node and an output terminal, respectively, and configured to output a first control signal from the first signal terminal to the output terminal under the control of the first node;

the second output circuit is connected with the output terminal, a second node, a first clock signal terminal and a second signal terminal, respectively, and configured to output a second control signal from the second signal terminal to the output terminal under the control of the second node and a first clock signal from the first clock signal terminal; and the control circuit is connected with the first node, the second node, the first signal terminal, the second signal terminal, the first clock signal terminal, a second clock signal terminal and an input terminal, respectively, and configured to control the potentials of the first node and the second node under the control of the first control signal from the first signal terminal, the second control signal from the second signal terminal, the first clock signal from the first clock signal terminal, a second clock signal from the second clock signal terminal and an input signal from the input terminal.

Optionally, the control circuit comprises a pull-down sub-circuit, a first pull-up sub-circuit, a control sub-circuit and a second pull-up sub-circuit, wherein the pull-down sub-circuit is connected with the second signal terminal, the first clock signal terminal, a third node and a fourth node, respectively, and configured to output the second control signal of the second signal terminal to the fourth node under the control of the third node and the first clock signal from the first clock signal terminal;

the first pull-up sub-circuit is connected with the input terminal, the first clock signal terminal, the third node and the fourth node, respectively, and configured to output the first clock signal to the third node and the fourth node, respectively, under the control of the input signal from the input terminal and the first clock signal from the first clock signal terminal;

the control sub-circuit is connected with the second clock signal terminal, the input terminal, the fourth node, the first node and the second node, respectively, and configured to output the input signal from the input terminal to the first node and outputting the potential of the fourth node to the second node under the control of the second clock signal from the second clock signal terminal; and the second pull-up sub-circuit is connected with the first signal terminal, the first node and the second node, respectively, and configured to output the first control signal from the first signal terminal to the second node under the control of the first node.

Optionally, the pull-down sub-circuit comprises a first transistor, a second transistor and a first capacitor, wherein a first terminal of the first transistor is connected with the second signal terminal, a second terminal of the first transistor is connected with the third node, and a third terminal of the first transistor is connected with the first clock signal terminal;

a first terminal of the second transistor is connected with the second signal terminal, a second terminal of the second transistor is connected with the fourth node, and a third terminal of the second transistor is connected with the third node; and a first terminal of the first capacitor is connected with the third node, and a second terminal of the first capacitor is connected with the second signal terminal.

Optionally, the first pull-up sub-circuit comprises a third transistor, a fourth transistor, a second capacitor and a fifth transistor, wherein a first terminal of the third transistor is connected with the input terminal, a second terminal of the third transistor is connected with a fifth node, and a third terminal of the third transistor is connected with the first clock signal terminal;

a first terminal of the fourth transistor is connected with the first clock signal terminal, a second terminal of the fourth transistor is connected with the third node, and a third terminal of the fourth transistor is connected with the fifth node;

a first terminal of the second capacitor is connected with the fifth node, and a second terminal of the second capacitor is connected with the fourth node; and a first terminal of the fifth transistor is connected with the first clock signal terminal, a second terminal of the fifth transistor is connected with the fourth node, and a third terminal of the fifth transistor is connected with the fifth node.

Optionally, the control sub-circuit comprises a sixth transistor and a seventh transistor, wherein a first terminal of the sixth transistor is connected with the input terminal, a second terminal of the sixth transistor is connected with the first node, and a third terminal of the sixth transistor is connected with the second clock signal terminal; and a first terminal of the seventh transistor is connected with the fourth node, a second terminal of the seventh transistor is connected with the second node, and a third terminal of the seventh transistor is connected with the second clock signal terminal.

Optionally, the second pull-up sub-circuit comprises an eighth transistor, wherein a first terminal of the eighth transistor is connected with the first signal terminal, a second terminal of the eighth transistor is connected with the second node, and a third terminal of the eighth transistor is connected with the first node.

Optionally, the first output circuit comprises a ninth transistor and a third capacitor, wherein a first terminal of the ninth transistor is connected with the first signal terminal, a second terminal of the ninth transistor is connected with the output terminal, and a third terminal of the ninth transistor is connected with the first node; and a first terminal of the third capacitor is connected with the first terminal of the ninth transistor, and a second terminal of the third capacitor is connected with the third terminal of the ninth transistor.

Optionally, the second output circuit comprises a tenth transistor and a fourth capacitor, wherein a first terminal of the tenth transistor is connected with the second signal terminal, a second terminal of the tenth transistor is connected with the output terminal, and a third terminal of the tenth transistor is connected with the second node; and a first terminal of the fourth capacitor is connected with the third terminal of the tenth transistor, and a second terminal of the fourth capacitor is connected with the first clock signal terminal.

Optionally, the transistors are all P-type transistors.

According to a second aspect of the disclosure, there is provided a shift register unit driving method for driving a shift register unit according to the first aspect, the shift register unit comprising a control circuit, a first output circuit and a second output circuit, wherein the method comprises:

in a first stage, an input signal inputted to an input terminal being of a second potential, a first clock signal inputted to a first clock signal terminal being of the second potential, a second clock signal inputted to a second clock signal terminal being of a first potential, a second node remaining at the second potential, and the second output circuit outputting a second control signal from a second signal terminal to an output terminal under the control of the second node, the potential of the second control signal being the second potential;

in a second stage, the input signal inputted to the input terminal being of the second potential, the first clock signal inputted to the first clock signal terminal being of the first potential, the second clock signal inputted to the second clock signal terminal being of the second potential, the control circuit outputting the input signal from the input terminal to a first node, and the first output circuit outputting a first control signal to the output terminal under the control of the first node, the potential of the first control signal being the first potential;

in a third stage, the input signal inputted to the input terminal being of the first potential, the first clock signal inputted to the first clock signal terminal being of the second potential, the second clock signal inputted to the second clock signal terminal being of the first potential, the first node remaining at the second potential, and the first output circuit outputting the first control signal to the output terminal under the control of the first node; and in a fourth stage, the input signal inputted to the input terminal being of the first potential, the first clock signal inputted to the first clock signal terminal being of the first potential, the second clock signal inputted to the second clock signal terminal being of the second potential, controlling the control circuit to output the second control signal from the second signal terminal to the second node, and the second output circuit outputting the second control signal to the output terminal under the control of the second node.

Optionally, the control circuit comprises a pull-down sub-circuit, a first pull-up sub-circuit, a control sub-circuit and a second pull-up sub-circuit, and wherein the method comprises:

in the third stage, the first clock signal inputted to the first clock signal terminal being of the second potential, and the pull-down sub-circuit outputting the second control signal from the second signal terminal to a fourth node;

in the second stage, the input signal inputted to the input terminal being of the second potential, the first clock signal inputted to the first clock signal terminal being of the first potential, and the first pull-up sub-circuit outputting the first clock signal to a third node and the fourth node, respectively;

in the second stage and the fourth stage, the second clock signal inputted to the second clock signal terminal being of the second potential, and the control sub-circuit outputting the input signal from the input terminal to the first node and outputting the potential of the fourth node to the second node;

in the second stage and the third stage, the first node being of the second potential, and the second pull-up sub-circuit outputting the first control signal from the first signal terminal to the second node.

Optionally, the pull-down sub-circuit comprises a first transistor, a second transistor and a first capacitor, and wherein the method comprises:

in the first stage and the third stage, the first clock signal inputted to the first clock signal terminal being of the second potential, the second control signal inputted to the second signal terminal being of the second potential, the first transistor and the second transistor being turned on, the first capacitor storing the second potential, and the second transistor outputting the second control signal from the second signal terminal to the fourth node; and in the fourth stage, a second terminal of the second transistor remaining at the second potential, the second transistor being turned on, and the second transistor outputting the second control signal from the second signal terminal to the fourth node.

Optionally, the first pull-up sub-circuit comprises a third transistor, a fourth transistor, a second capacitor and a fifth transistor, and wherein the method comprises:

in the first stage, the input signal inputted to the input terminal being of the second potential, the first clock signal inputted to the first clock signal terminal being of the second potential, the third transistor, the fourth transistor and the fifth transistor being turned on, the second capacitor storing the second potential, the fourth transistor outputting the first clock signal from the first clock signal terminal to the third node, and the fifth transistor outputting the first clock signal to the fourth node; and in the second stage, the input signal inputted to the input terminal being of the second potential, the first clock signal inputted to the first clock signal terminal being of the first potential, the third transistor being turned off, a fifth node remaining at the second potential, the fourth transistor and the fifth transistor being turned on, the fourth transistor outputting the first clock signal from the first clock signal terminal to the third node, and the fifth transistor outputting the first clock signal to the fourth node.

Optionally, the control sub-circuit comprises a sixth transistor and a seventh transistor, and wherein the method comprises:

in the second stage and the fourth stage, the second clock signal inputted to the second clock signal terminal being of the second potential, the sixth transistor and the seventh transistor being turned on, the sixth transistor outputting the input signal from the input terminal to the first node, and the seventh transistor outputting the potential of the fourth node to the second node.

Optionally, the second pull-up sub-circuit comprises an eighth transistor, and wherein the method comprises:

in the second stage and the third stage, the first node being of the second potential, the eighth transistor being turned on, and the eighth transistor outputting the first control signal from the first signal terminal to the second node.

Optionally, the first output circuit comprises a ninth transistor and a third capacitor, and wherein the method comprises:

in the second stage, the control circuit outputting the input signal from the input terminal to the first node, the input signal being at the second potential, the ninth transistor being turned on, the third capacitor storing the second potential, and the ninth transistor outputting the first control signal from the first signal terminal to the output terminal; and in the third stage, the first node remaining at the second potential, the ninth transistor being turned on, and the ninth transistor outputting the first control signal from the first signal terminal to the output terminal.

Optionally, the second output circuit comprises a tenth transistor and a fourth capacitor, and wherein the method comprises:

in the fourth stage, the control circuit outputting the second control signal from the second signal terminal to the second node, the second control signal being of the second potential, the tenth transistor being turned on, the fourth capacitor storing the second potential, and the tenth transistor outputting the second control signal from the second signal terminal to the output terminal; and in the first stage, the second node remaining at the second potential, the tenth transistor being turned on, and the tenth transistor outputting the second control signal from the second signal terminal to the output terminal.

Optionally, the transistors are all P-type transistors.

Optionally, the first potential is a high potential relative to the second potential.

According to a third aspect of the disclosure, an embodiment of the disclosure provides a gate driving circuit comprising at least two cascaded shift register units as described in the first aspect.

According to a fourth aspect of the disclosure, an embodiment of the disclosure provides a display device comprising a gate driving circuit as described in the third aspect.

BRIEF DESCRIPTION OF THE DRAWINGS

To more clearly illustrating the technical solutions in embodiments of the disclosure, in the following, non-limiting and non-exhaustive embodiments of the disclosure will be described with reference to the drawings, in which.

DETAILED DESCRIPTION

Figure 1:
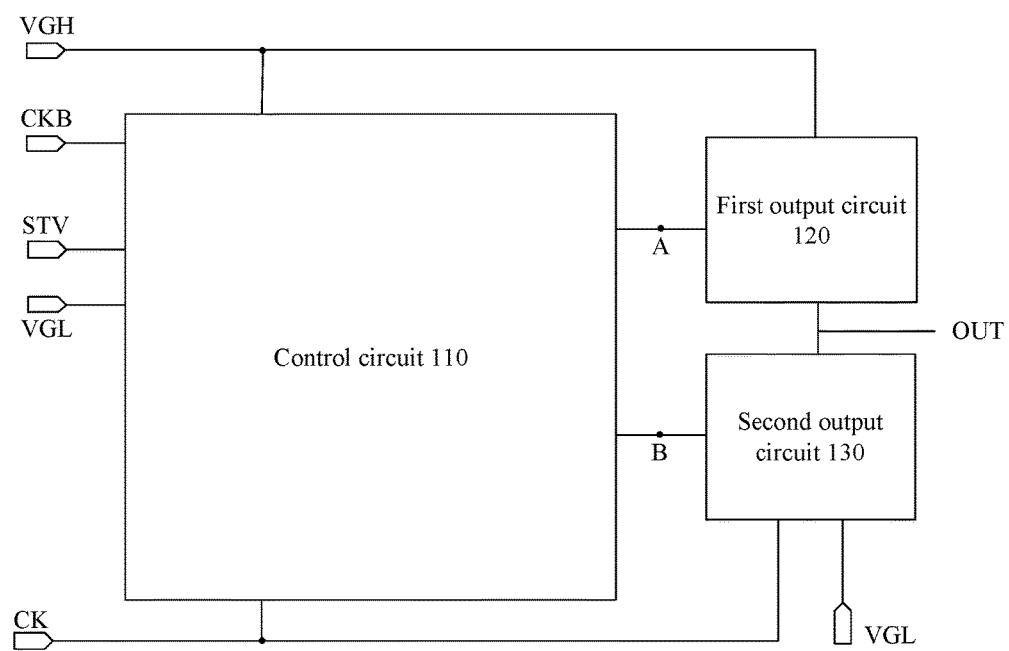
FIG. 1 is a structure diagram of a shift register unit provided by an embodiment of the disclosure.

In the following, the embodiments of the disclosure will be further described in detail in conjunction with the drawings, to make the objectives, technical solutions and advantages of the disclosure clearer.

The transistors employed in all the embodiments of the disclosure may all be thin film transistors or field effect transistors or other devices with the same characteristics. According to their roles in a circuit, the transistors employed in the embodiments of the disclosure mainly act as switch transistors. Since the source and drain of a switch transistor employed herein are symmetric, its source and drain are interchangeable. In the embodiments of the disclosure, the source of a transistor is called a first terminal, the drain is called a second terminal, and the gate is called a third terminal. In the drawings, it is specified that the middle terminal of a transistor is the gate, the signal input terminal is the source, and the signal output terminal is the drain. In addition, the switch transistors employed in the embodiments of the disclosure comprise P-type switch transistors and N-type switch transistors. A P-type switch transistor is on when the gate is at a low level and is off when the gate is at a high level. An N-type switch transistor is on when the gate is at a high level and is off when the gate is at a low level. In addition, for multiple signals in various embodiments of the disclosure, there are respectively a first potential and a second potential, which only represents that the potential of a signal has 2 state quantities, and does not represent that the first potential or the second potential has a specific value. A first control signal may be a high-level signal, and a second control signal may be a low-level signal.

FIG. 1 is a structure diagram of a shift register unit provided by an embodiment of the disclosure. The shift register unit may comprise a control circuit 110, a first output circuit 120 and a second output circuit 130.

The first output circuit 120 is connected with a first signal terminal VGH, a first node A and an output terminal OUT, respectively, and configured to output a first control signal from the first signal terminal VGH to the output terminal OUT under the control of the first node A. The potential of the first control signal is a first potential.

The second output circuit 130 is connected with the output terminal OUT, a second node B, a first clock signal terminal CK and a second signal terminal VGL, respectively, and configured to output a second control signal from the second signal terminal VGL to the output terminal OUT under the control of the second node B and a first clock signal from the first clock signal terminal CK. The potential of the second control signal is a second potential.

The control circuit 110 is connected with the first node A, the second node B, the first signal terminal VGH, the second signal terminal VGL, the first clock signal terminal CK, a second clock signal terminal CKB and an input terminal STV, respectively, and configured to control the potentials of the first node A and the second node B under the control of the first control signal from the first signal terminal VGH, the second control signal from the second signal terminal VGL, the first clock signal from the first clock signal terminal CK, a second clock signal from the second clock signal terminal CKB and an input signal from the input terminal STV.

From the above, a shift register unit provided by an embodiment of the disclosure comprises a control circuit, a first output circuit and a second output circuit; the shift register unit can control the level of the potential outputted by an output terminal via the control circuit, the first output circuit and the second output circuit; and both the circuit structure and the control process of the shift register unit provided by the embodiment of the disclosure are relatively simple.

Figure 2:
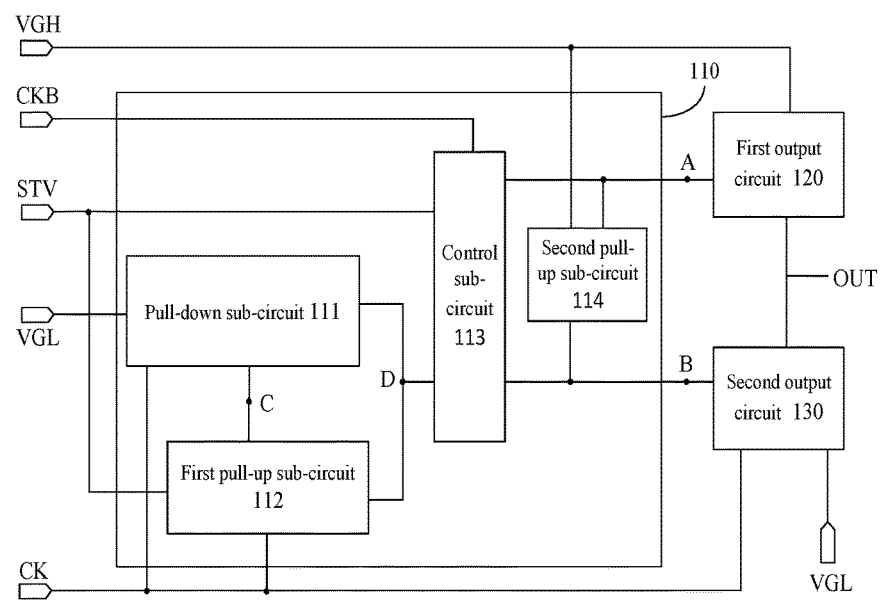
FIG. 2 is a structure diagram of another shift register unit provided by an embodiment of the disclosure.

FIG. 2 is a structure diagram of another shift register unit provided by an embodiment of the disclosure. Additional components are added to the shift register unit on the basis of the shift register unit shown in FIG. 1, such that the shift register unit provided by the embodiment of the disclosure has good performance. As shown in FIG. 2, the control circuit 110 comprises a pull-down sub-circuit 111, a first pull-up sub-circuit 112, a control sub-circuit 113 and a second pull-up sub-circuit 114.

The pull-down sub-circuit 111 is connected with the second signal terminal VGL, the first clock signal terminal CK, a third node C and a fourth node D, respectively, and configured to output the second control signal of the second signal terminal VGL to the fourth node D under the control of the third node C and the first clock signal from the first clock signal terminal CK.

The first pull-up sub-circuit 112 is connected with the input terminal STV, the first clock signal terminal CK, the third node C and the fourth node D, respectively, and configured to output the first clock signal to the third node C and the fourth node D, respectively, under the control of the input signal from the input terminal STV and the first clock signal from the first clock signal terminal CK.

The control sub-circuit 113 is connected with the second clock signal terminal CKB, the input terminal STV, the fourth node D, the first node A and the second node B, respectively, and configured to output the input signal from the input terminal STV to the first node A and outputting the potential of the fourth node D to the second node B under the control of the second clock signal from the second clock signal terminal CKB.

The second pull-up sub-circuit 114 is connected with the first signal terminal VGH, the first node A and the second node B, respectively, and configured to output the first control signal from the first signal terminal VGH to the second node B under the control of the first node A.

Figure 3:
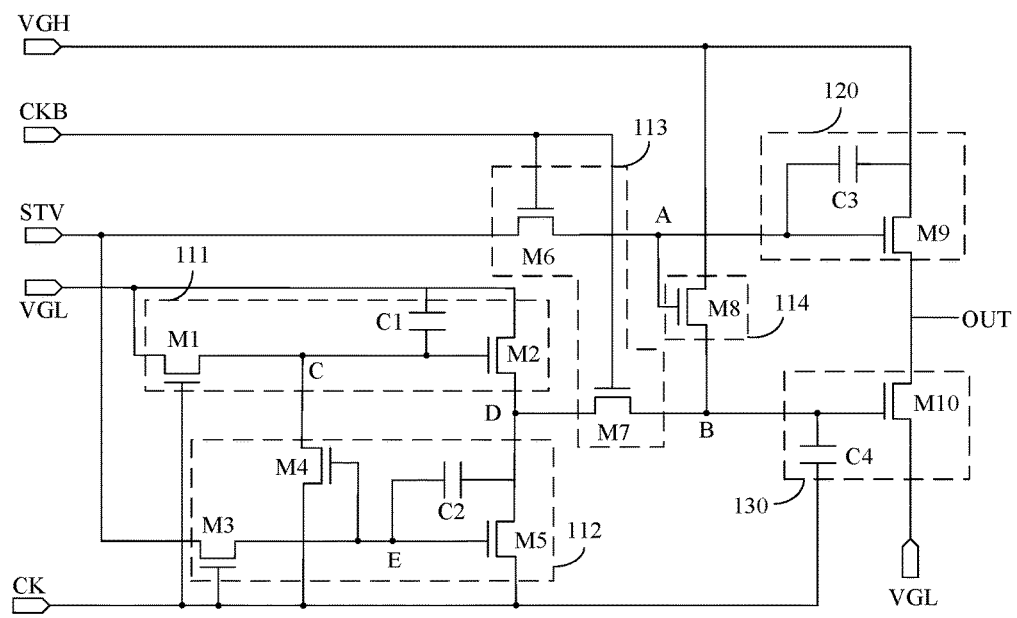
FIG. 3 is a structure diagram of yet another shift register unit provided by an embodiment of the disclosure.

FIG. 3 is a structure diagram of yet another shift register unit provided by an embodiment of the disclosure. As shown in FIG. 3, the pull-down sub-circuit 111 comprises a first transistor M1, a second transistor M2 and a first capacitor C1.

A first terminal of the first transistor M1 is connected with the second signal terminal VGL, a second terminal of the first transistor M1 is connected with the third node C, and a third terminal of the first transistor M1 is connected with the first clock signal terminal CK.

A first terminal of the second transistor M2 is connected with the second signal terminal VGL, a second terminal of the second transistor M2 is connected with the fourth node D, and a third terminal of the second transistor M2 is connected with the third node C.

A first terminal of the first capacitor C1 is connected with the third node C, and a second terminal of the first capacitor C1 is connected with the second signal terminal VGL.

Optionally, as shown in FIG. 3, the first pull-up sub-circuit 112 comprises a third transistor M3, a fourth transistor M4, a second capacitor C2 and a fifth transistor M5.

A first terminal of the third transistor M3 is connected with the input terminal STV, a second terminal of the third transistor M3 is connected with a fifth node E, and a third terminal of the third transistor M3 is connected with the first clock signal terminal CK.

A first terminal of the fourth transistor M4 is connected with the first clock signal terminal CK, a second terminal of the fourth transistor M4 is connected with the third node C, and a third terminal of the fourth transistor M4 is connected with the fifth node E.

A first terminal of the second capacitor C2 is connected with the fifth node E, and a second terminal of the second capacitor C2 is connected with the fourth node D.

A first terminal of the fifth transistor M5 is connected with the first clock signal terminal CK, a second terminal of the fifth transistor M5 is connected with the fourth node D, and a third terminal of the fifth transistor M5 is connected with the fifth node E.

Optionally, as shown in FIG. 3, the control sub-circuit 113 comprises a sixth transistor M6 and a seventh transistor M7.

A first terminal of the sixth transistor M6 is connected with the input terminal STV, a second terminal of the sixth transistor M6 is connected with the first node A, and a third terminal of the sixth transistor M6 is connected with the second clock signal terminal CKB.

A first terminal of the seventh transistor M7 is connected with the fourth node D, a second terminal of the seventh transistor M7 is connected with the second node B, and a third terminal of the seventh transistor M7 is connected with the second clock signal terminal CKB.

Optionally, as shown in FIG. 3, the second pull-up sub-circuit 114 comprises an eighth transistor M8.

A first terminal of the eighth transistor M8 is connected with the first signal terminal VGH, a second terminal of the eighth transistor M8 is connected with the second node B, and a third terminal of the eighth transistor M8 is connected with the first node A.

Optionally, as shown in FIG. 3, the first output circuit 120 comprises a ninth transistor M9 and a third capacitor C3.

A first terminal of the ninth transistor M9 is connected with the first signal terminal VGH, a second terminal of the ninth transistor M9 is connected with the output terminal OUT, and a third terminal of the ninth transistor M9 is connected with the first node A.

A first terminal of the third capacitor C3 is connected with the first terminal of the ninth transistor M9, and a second terminal of the third capacitor C3 is connected with the third terminal of the ninth transistor M9.

Optionally, as shown in FIG. 3, the second output circuit 130 comprises a tenth transistor M10 and a fourth capacitor C4.

A first terminal of the tenth transistor M10 is connected with the second signal terminal VGL, a second terminal of the tenth transistor M10 is connected with the output terminal OUT, and a third terminal of the tenth transistor M10 is connected with the second node B.

A first terminal of the fourth capacitor C4 is connected with the third terminal of the tenth transistor M10, and a second terminal of the fourth capacitor C4 is connected with the first clock signal terminal CK.

The shift register unit provided by the embodiment of the disclosure accomplishes control of the size of the potential of the output terminal via ten transistors and four capacitors, which thereby simplifies the structure of the shift register unit, achieves the effect of reducing the layout area of the shift register unit, and is beneficial to the manufacture of a high-resolution display device.

Figure 4:
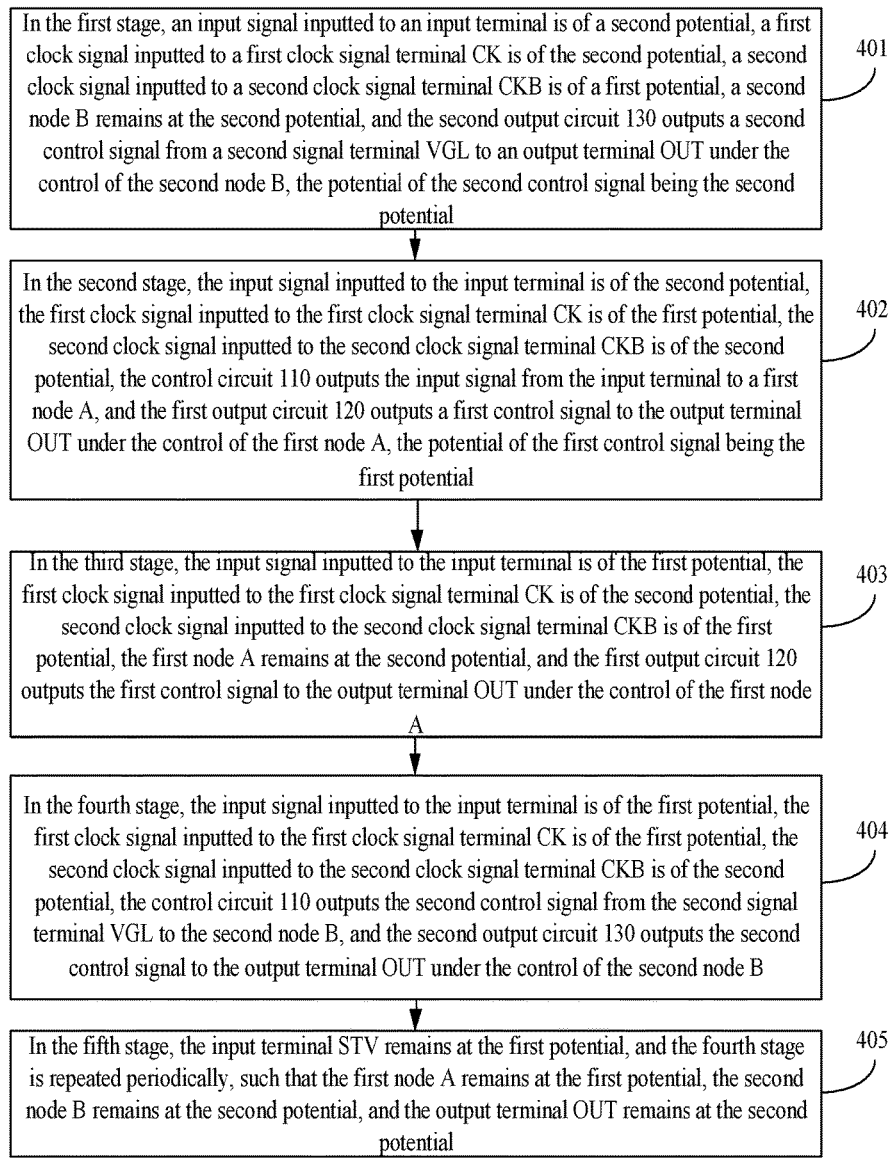
FIG. 4 is a flow chart of a shift register unit driving method provided by an embodiment of the disclosure.

FIG. 4 is a flow chart of a shift register unit driving method provided by an embodiment of the disclosure. The structure of the shift register unit may be as shown in FIG. 1. The shift register unit may comprise a control circuit 110, a first output circuit 120 and a second output circuit 130. The shift register unit driving method comprises the following steps.

A first stage is described at step 401. In the first stage, an input signal inputted to an input terminal STV is of a second potential, a first clock signal inputted to a first clock signal terminal CK is of the second potential, a second clock signal inputted to a second clock signal terminal CKB is of a first potential, a second node B remains at the second potential, and the second output circuit 130 outputs a second control signal from a second signal terminal VGL to an output terminal OUT under the control of the second node B, the potential of the second control signal being the second potential.

A second stage is described at step 402. In the second stage, the input signal inputted to the input terminal STV is of the second potential, the first clock signal inputted to the first clock signal terminal CK is of the first potential, the second clock signal inputted to the second clock signal terminal CKB is of the second potential, the control circuit 110 outputs the input signal from the input terminal to a first node A, and the first output circuit 120 outputs a first control signal to the output terminal OUT under the control of the first node A, the potential of the first control signal being the first potential.

A third stage is described at step 403. In the third stage, the input signal inputted to the input terminal STV is of the first potential, the first clock signal inputted to the first clock signal terminal CK is of the second potential, the second clock signal inputted to the second clock signal terminal CKB is of the first potential, the first node A remains at the second potential, and the first output circuit 120 outputs the first control signal to the output terminal OUT under the control of the first node A.

A fourth stage is described at step 404. In the fourth stage, the input signal inputted to the input terminal STV is of the first potential, the first clock signal inputted to the first clock signal terminal CK is of the first potential, the second clock signal inputted to the second clock signal terminal CKB is of the second potential, the control circuit 110 outputs the second control signal from the second signal terminal VGL to the second node B, and the second output circuit 130 outputs the second control signal to the output terminal OUT under the control of the second node B.

A fifth stage is described at step 405. In the fifth stage, the input terminal STV remains at the first potential and the fourth stage is repeated periodically, such that the first node A remains at the first potential, the second node B remains at the second potential, and the output terminal OUT remains at the second potential.

The foregoing fifth stage is a low potential maintenance stage. That is to say, the shift register unit driving method provide by the embodiment of the disclosure may control the level of the potential outputted by the output terminal OUT by controlling the maintenance time of the input terminal STV at the first potential and the second potential.

It needs to be noted that, in an initialization stage, the first node A of the shift register unit may always remain at the first potential, and the second node B may always remain at the second potential, such that the second output circuit 130 continuously outputs the second control signal from the second signal terminal VGL to the output terminal OUT. After signals are inputted to the input terminal STV, the first clock signal terminal CK and the second clock signal terminal CKB, the shift register unit may cyclically implement the driving method shown in the first to fifth stages.

From the above, the shift register unit driving method provided by the embodiment of the disclosure can control the high or low level of the potential outputted by the output terminal via the control circuit, the first output circuit and the second output circuit in the shift register unit, and the control process of the shift register unit driving method is relatively simple.

Optionally, as shown in FIG. 2, the control circuit 110 comprises a pull-down sub-circuit 111, a first pull-up sub-circuit 112, a control sub-circuit 113 and a second pull-up sub-circuit 114.

In such a case, in the third stage, the first clock signal inputted to the first clock signal terminal CK is of the second potential, and the pull-down sub-circuit 111 outputs the second control signal from the second signal terminal VGL to a fourth node D.

In the second stage, the input signal inputted to the input terminal STV is of the second potential, the first clock signal inputted to the first clock signal terminal CK is of the first potential, and the first pull-up sub-circuit 112 outputs the first clock signal to a third node C and the fourth node D, respectively.

In the second stage and the fourth stage, the second clock signal inputted to the second clock signal terminal CKB is of the second potential, and the control sub-circuit 113 outputs the input signal from the input terminal STV to the first node A and outputs the potential of the fourth node D to the second node B.

In the second stage and the third stage, the first node A is of the second potential, and the second pull-up sub-circuit 114 outputs the first control signal from the first signal terminal VGH to the second node B.

Optionally, as shown in FIG. 3, the pull-down sub-circuit 111 comprises a first transistor M1, a second transistor M2 and a first capacitor C1.

In such a case, in the first stage and the third stage, the first clock signal inputted to the first clock signal terminal CK is of the second potential, the second control signal inputted to the second signal terminal VGL is of the second potential, the first transistor M1 and the second transistor M2 are turned on, the first capacitor C1 stores the second potential, and the second transistor M2 outputs the second control signal from the second signal terminal VGL to the fourth node D.

In the fourth stage, since the first capacitor C1 stored the second potential in the third stage, a second terminal of the second transistor M2 can continuously remain at the second potential in the fourth stage. Therefore, the second transistor M2 is turned on, and the second signal terminal VGL outputs the second control signal to the fourth node D.

Optionally, as shown in FIG. 3, the first pull-up sub-circuit 112 comprises a third transistor M3, a fourth transistor M4, a second capacitor C2 and a fifth transistor M5.

In such a case, in the first stage, the first clock signal inputted to the first clock signal terminal CK is of the second potential, and the third transistor M3 is turned on. The third transistor M3 outputs the input signal from the input terminal STV to a fifth node E. At this point, the input signal is of the second potential, and therefore the fourth transistor M4 and the fifth transistor M5 are turned on. The second capacitor C2 stores the second potential, the fourth transistor M4 outputs the first clock signal from the first clock signal terminal CK to the third node C, and at the same time the fifth transistor M5 outputs the first clock signal to the fourth node D. At this point, the first clock signal is of the second potential.

In the second stage, the input signal inputted to the input terminal STV is of the second potential, and the third transistor M3 is turned off. Since the second capacitor stored a low potential in the first stage, the fifth node E can continue to remain at the second potential in the second stage. At this point, the fourth transistor M4 and the fifth transistor M5 are turned on, the fourth transistor M4 outputs the first clock signal from the first clock signal terminal CK to the third node C, and at the same time the fifth transistor M5 outputs the first clock signal to the fourth node D. At this point, the first clock signal is of the first potential. Since the third terminal of the second transistor M2 in the pull-down sub-circuit 111 is connected with the third node C, the second transistor M2 is turned off, such that the fourth node D can stably remain at the first potential.

Optionally, as shown in FIG. 3, the control sub-circuit 113 comprises a sixth transistor M6 and a seventh transistor M7.

In such a case, in the second stage and the fourth stage, the second clock signal inputted to the second clock signal terminal CKB is of the second potential, and therefore the sixth transistor M6 and the seventh transistor M7 are turned on. At this point, the sixth transistor M6 outputs the input signal from the input terminal STV to the first node A, and the seventh transistor M7 outputs the potential of the fourth node D to the second node B.

In the second stage, since the input signal inputted to the input terminal STV is of the second potential and the potential of the fourth node D is the first potential, the signal outputted to the first node A by the sixth transistor M6 is at the second potential, and the signal outputted to the second node B by the seventh transistor M7 is at the first potential. At this point, the first output circuit 120 outputs the first control signal from the first signal terminal VGH to the output terminal.

In the fourth stage, since the input signal inputted to the input terminal STV is of the first potential and the potential of the fourth node D is the second potential, the signal outputted to the first node A by the sixth transistor M6 is at the first potential, and the signal outputted to the second node B by the seventh transistor M7 is at the second potential. At this point, the second output circuit 130 outputs the second control signal from the second signal terminal VGL to the output terminal.

Optionally, as shown in FIG. 3, the second pull-up sub-circuit 114 comprises an eighth transistor M8.

In such a case, in the second stage and the third stage, the first node A is of the second potential, and therefore the eighth transistor M8 is turned on. The eighth transistor M8 outputs the first control signal from the first signal terminal VGH to the second node B, and the potential of the first control signal is the first potential, and therefore, in the second stage and the third stage, a tenth transistor M10 in the second output circuit 130 is in a turn-off state.

Optionally, as shown in FIG. 3, the first output circuit 120 comprises a ninth transistor M9 and a third capacitor C3.

In such a case, in the second stage, the control circuit 110 outputs the input signal from the input terminal STV to the first node A, and the input signal is at the second potential, and therefore, the ninth transistor M9 is turned on, and the third capacitor C3 stores the second potential. The ninth transistor M9 outputs the first control signal from the first signal terminal VGH to the output terminal OUT and the first control signal is of the first potential, and so, at this point, the potential of the output signal outputted by the output terminal OUT is the first potential.

In the third stage, the first node A remains at the second potential, and therefore the ninth transistor M9 is turned on. The ninth transistor M9 outputs the first control signal from the first signal terminal VGH to the output terminal OUT, and so, at this point, the potential of the output signal outputted by the output terminal OUT is the first potential.

Optionally, as shown in FIG. 3, the second output circuit 130 comprises a tenth transistor M10 and a fourth capacitor C4.

In such a case, in the fourth stage, the control circuit 110 outputs the second control signal from the second signal terminal VGL to the second node B, and the second control signal is of the second potential, and therefore the tenth transistor M10 is turned on, and the fourth capacitor C4 stores the second potential. The tenth transistor M10 outputs the second control signal from the second signal terminal VGL to the output terminal OUT, and the potential of the second control signal is the second potential, and therefore, at this point, the potential of the output signal outputted by the output terminal OUT is the second potential.

In the first stage, the second node B remains at the second potential, and therefore the tenth transistor M10 is turned on, and the tenth transistor M10 outputs the second control signal from the second signal terminal VGL to the output terminal OUT.

It needs to be noted that in the embodiment of the disclosure, the operating voltages of both the first signal terminal VGH and the second signal terminal VGL are DC voltages. The operating voltage of the first signal terminal VGH may be 7 volts (V), and the operating voltage of the second signal terminal VGL may be −7V.

Figure 5:
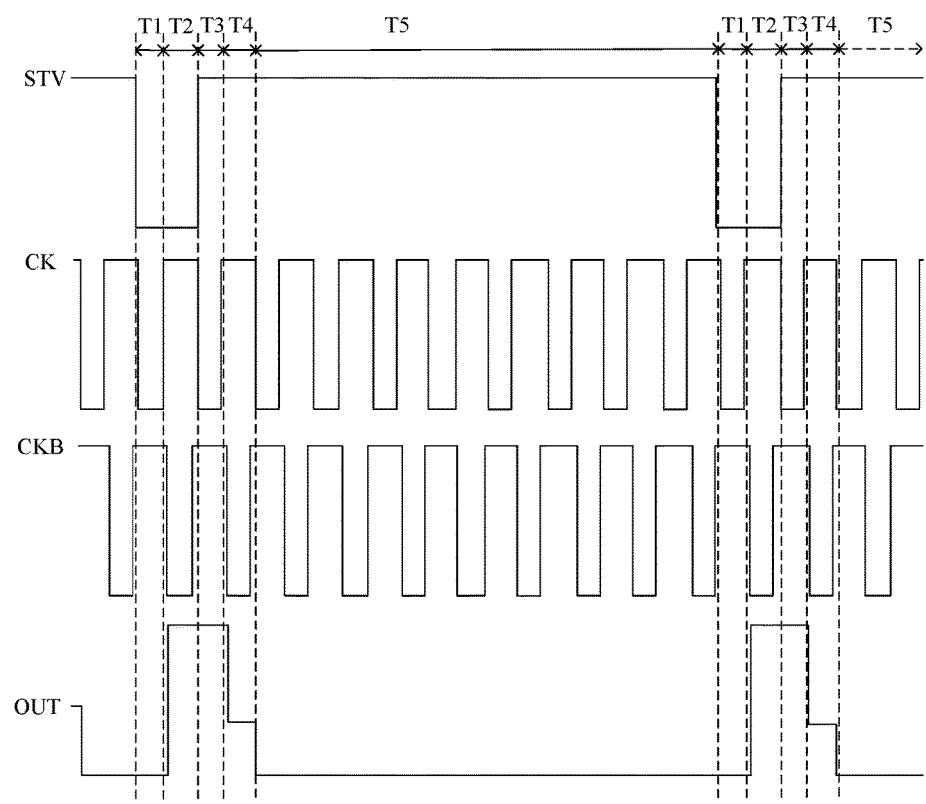
FIG. 5 is a schematic diagram of potential changes of the input terminal, the first clock signal terminal, the second clock signal terminal and the output terminal in the embodiments of the disclosure.

In addition, the potential changes of the first clock signal terminal CK, the second clock signal terminal CKB, the input terminal STV and the output terminal OUT involved in the individual embodiments of the disclosure in the first stage T1, the second stage T2, the third stage T3, the fourth stage T4 and the fifth stage T5 may be referred to FIG. 5. In FIG. 5, the horizontal axis represents time, and the vertical axis represents potential.

Further, as shown in FIG. 5, the shift register unit provided by the embodiments of the disclosure may cyclically implement the driving method shown in the first to fifth stages.

The shift register unit driving method provided by the embodiments of the disclosure can control the size of the potential outputted by the output terminal via the control circuit, the first output circuit and the second output circuit in the shift register unit, and therefore the control process of the shift register unit driving method is relatively simple.

It needs to be noted that, the above embodiments are illustrated taking that the first transistor M1, the second transistor M2, the third transistor M3, the fourth transistor M4, the fifth transistor M5, the sixth transistor M6, the seventh transistor M7, the eighth transistor M8, the ninth transistor M9 and the tenth transistor M10 are P-type transistors, and the first potential is a high potential and the second potential is a low potential, as an example. Of course, the first to tenth transistors may further employ N-type transistors. When the first to tenth transistors employ N-type transistors, the first potential is a low potential and the second potential is a high potential. At this point, the potential changes of the first clock signal terminal CK, the second clock signal terminal CKB and the input terminal STV may be opposite to those shown in FIG. 5 (i.e., the difference in phase between them is 180 degrees).

An embodiment of the disclosure provides a gate driving circuit, which may comprise at least two cascaded shift register units as shown in FIG. 1, FIG. 2 or FIG. 3.

In addition, an embodiment of the disclosure further provides a display device comprising a gate driving circuit. The gate driving circuit may comprise at least two cascaded shift register units as shown in FIG. 1, FIG. 2 or FIG. 3. The display device may be any product or component with the display function, such as a liquid crystal panel, an electronic paper, an OLED panel, an AMOLED panel, a mobile phone, a tablet computer, a television set, a display, a notebook computer, a digital photo frame, a navigator, etc.

What are described above are just optional embodiments of the disclosure, and are not intended for limiting the disclosure. Within the spirit and principles of the disclosure, any modifications, equivalent substitutions, and improvements, etc. that are made should be comprised in the protection scope of the disclosure.

The invention claimed is:

1. A shift register unit driving method for driving a shift register unit, the shift register unit comprising a control circuit, a first output circuit and a second output circuit, wherein the first output circuit is connected with a first signal terminal, a first node and an output terminal, respectively, and configured to output a first control signal from the first signal terminal to the output terminal under the control of the first node;

the second output circuit is connected with the output terminal, a second node, a first clock signal terminal and a second signal terminal, respectively, and configured to output a second control signal from the second signal terminal to the output terminal under the control of the second node and a first clock signal from the first clock signal terminal; and the control circuit is connected with the first node, the second node, the first signal terminal, the second signal terminal, the first clock signal terminal, a second clock signal terminal and an input terminal, respectively, and configured to control the potentials of the first node and the second node under the control of the first control signal from the first signal terminal, the second control signal from the second signal terminal, the first clock signal from the first clock signal terminal, a second clock signal from the second clock signal terminal and an input signal from the input terminal, wherein the method comprises:

in a first stage, the input signal inputted to the input terminal being of a second potential, the first clock signal inputted to the first clock signal terminal being of the second potential, the second clock signal inputted to the second clock signal terminal being of a first potential, the second node remaining at the second potential, and the second output circuit outputting the second control signal from the second signal terminal to the output terminal under the control of the second node, the potential of the second control signal being the second potential;

in a second stage, the input signal inputted to the input terminal being of the second potential, the first clock signal inputted to the first clock signal terminal being of the first potential, the second clock signal inputted to the second clock signal terminal being of the second potential, the control circuit outputting the input signal from the input terminal to the first node, and the first output circuit outputting the first control signal to the output terminal under the control of the first node, the potential of the first control signal being the first potential;

in a third stage, the input signal inputted to the input terminal being of the first potential, the first clock signal inputted to the first clock signal terminal being of the second potential, the second clock signal inputted to the second clock signal terminal being of the first potential, the first node remaining at the second potential, and the first output circuit outputting the first control signal to the output terminal under the control of the first node; and in a fourth stage, the input signal inputted to the input terminal being of the first potential, the first clock signal inputted to the first clock signal terminal being of the first potential, the second clock signal inputted to the second clock signal terminal being of the second potential, controlling the control circuit to output the second control signal from the second signal terminal to the second node, and the second output circuit outputting the second control signal to the output terminal under the control of the second node.

2. The method as claimed in claim 1, wherein the control circuit comprises a pull-down sub-circuit, a first pull-up sub-circuit, a control sub-circuit and a second pull-up sub-circuit, and wherein the method comprises:

in the third stage, the first clock signal inputted to the first clock signal terminal being of the second potential, and the pull-down sub-circuit outputting the second control signal from the second signal terminal to a fourth node;

in the second stage, the input signal inputted to the input terminal being of the second potential, the first clock signal inputted to the first clock signal terminal being of the first potential, and the first pull-up sub-circuit outputting the first clock signal to a third node and the fourth node, respectively;

in the second stage and the fourth stage, the second clock signal inputted to the second clock signal terminal being of the second potential, and the control sub-circuit outputting the input signal from the input terminal to the first node and outputting the potential of the fourth node to the second node;

in the second stage and the third stage, the first node being of the second potential, and the second pull-up sub-circuit outputting the first control signal from the first signal terminal to the second node.

3. The method as claimed in claim 2, wherein the pull-down sub-circuit comprises a first transistor, a second transistor and a first capacitor, and wherein the method comprises:

in the first stage and the third stage, the first clock signal inputted to the first clock signal terminal being of the second potential, the second control signal inputted to the second signal terminal being of the second potential, the first transistor and the second transistor being turned on, the first capacitor storing the second potential, and the second transistor outputting the second control signal from the second signal terminal to the fourth node; and in the fourth stage, a second terminal of the second transistor remaining at the second potential, the second transistor being turned on, and the second transistor outputting the second control signal from the second signal terminal to the fourth node.

4. The method as claimed in claim 3, wherein the transistors are all P-type transistors.

5. The method as claimed in claim 2, wherein the first pull-up sub-circuit comprises a third transistor, a fourth transistor, a second capacitor and a fifth transistor, and wherein the method comprises:

in the first stage, the input signal inputted to the input terminal being of the second potential, the first clock signal inputted to the first clock signal terminal being of the second potential, the third transistor, the fourth transistor and the fifth transistor being turned on, the second capacitor storing the second potential, the fourth transistor outputting the first clock signal from the first clock signal terminal to the third node, and the fifth transistor outputting the first clock signal to the fourth node; and in the second stage, the input signal inputted to the input terminal being of the second potential, the first clock signal inputted to the first clock signal terminal being of the first potential, the third transistor being turned off, a fifth node remaining at the second potential, the fourth transistor and the fifth transistor being turned on, the fourth transistor outputting the first clock signal from the first clock signal terminal to the third node, and the fifth transistor outputting the first clock signal to the fourth node.

6. The method as claimed in claim 2, wherein the control sub-circuit comprises a sixth transistor and a seventh transistor, and wherein the method comprises:

in the second stage and the fourth stage, the second clock signal inputted to the second clock signal terminal being of the second potential, the sixth transistor and the seventh transistor being turned on, the sixth transistor outputting the input signal from the input terminal to the first node, and the seventh transistor outputting the potential of the fourth node to the second node.

7. The method as claimed in claim 2, wherein the second pull-up sub-circuit comprises an eighth transistor, and wherein the method comprises:

in the second stage and the third stage, the first node being of the second potential, the eighth transistor being turned on, and the eighth transistor outputting the first control signal from the first signal terminal to the second node.

8. The method as claimed in claim 1, wherein the first output circuit comprises a ninth transistor and a third capacitor, and wherein the method comprises:

in the second stage, the control circuit outputting the input signal from the input terminal to the first node, the input signal being at the second potential, the ninth transistor being turned on, the third capacitor storing the second potential, and the ninth transistor outputting the first control signal from the first signal terminal to the output terminal; and in the third stage, the first node remaining at the second potential, the ninth transistor being turned on, and the ninth transistor outputting the first control signal from the first signal terminal to the output terminal.

9. The method as claimed in claim 1, wherein the second output circuit comprises a tenth transistor and a fourth capacitor, and wherein the method comprises:

in the fourth stage, the control circuit outputting the second control signal from the second signal terminal to the second node, the second control signal being of the second potential, the tenth transistor being turned on, the fourth capacitor storing the second potential, and the tenth transistor outputting the second control signal from the second signal terminal to the output terminal; and in the first stage, the second node remaining at the second potential, the tenth transistor being turned on, and the tenth transistor outputting the second control signal from the second signal terminal to the output terminal.

10. The method as claimed in claim 1, wherein the control circuit comprises a pull-down sub-circuit, a first pull-up sub-circuit, a control sub-circuit and a second pull-up sub-circuit; and the pull-down sub-circuit is connected with the second signal terminal, the first clock signal terminal, a third node and a fourth node, respectively, and configured to output the second control signal of the second signal terminal to the fourth node under the control of the third node and the first clock signal from the first clock signal terminal;

the first pull-up sub-circuit is connected with the input terminal, the first clock signal terminal, the third node and the fourth node, respectively, and configured to output the first clock signal to the third node and the fourth node, respectively, under the control of the input signal from the input terminal and the first clock signal from the first clock signal terminal;

the control sub-circuit is connected with the second clock signal terminal, the input terminal, the fourth node, the first node and the second node, respectively, and configured to output the input signal from the input terminal to the first node and outputting the potential of the fourth node to the second node under the control of the second clock signal from the second clock signal terminal; and the second pull-up sub-circuit is connected with the first signal terminal, the first node and the second node, respectively, and configured to output the first control signal from the first signal terminal to the second node under the control of the first node.

11. The method as claimed in claim 10, wherein the pull-down sub-circuit comprises a first transistor, a second transistor and a first capacitor; and a first terminal of the first transistor is connected with the second signal terminal, a second terminal of the first transistor is connected with the third node, and a third terminal of the first transistor is connected with the first clock signal terminal;

a first terminal of the second transistor is connected with the second signal terminal, a second terminal of the second transistor is connected with the fourth node, and a third terminal of the second transistor is connected with the third node; and a first terminal of the first capacitor is connected with the third node, and a second terminal of the first capacitor is connected with the second signal terminal.

12. The method as claimed in claim 10, wherein the first pull-up sub-circuit comprises a third transistor, a fourth transistor, a second capacitor and a fifth transistor; and a first terminal of the third transistor is connected with the input terminal, a second terminal of the third transistor is connected with a fifth node, and a third terminal of the third transistor is connected with the first clock signal terminal;

a first terminal of the fourth transistor is connected with the first clock signal terminal, a second terminal of the fourth transistor is connected with the third node, and a third terminal of the fourth transistor is connected with the fifth node;

a first terminal of the second capacitor is connected with the fifth node, and a second terminal of the second capacitor is connected with the fourth node; and a first terminal of the fifth transistor is connected with the first clock signal terminal, a second terminal of the fifth transistor is connected with the fourth node, and a third terminal of the fifth transistor is connected with the fifth node.

13. The method as claimed in claim 10, wherein the control sub-circuit comprises a sixth transistor and a seventh transistor; and a first terminal of the sixth transistor is connected with the input terminal, a second terminal of the sixth transistor is connected with the first node, and a third terminal of the sixth transistor is connected with the second clock signal terminal; and a first terminal of the seventh transistor is connected with the fourth node, a second terminal of the seventh transistor is connected with the second node, and a third terminal of the seventh transistor is connected with the second clock signal terminal.

14. The method as claimed in claim 10, wherein the second pull-up sub-circuit comprises an eighth transistor; and a first terminal of the eighth transistor is connected with the first signal terminal, a second terminal of the eighth transistor is connected with the second node, and a third terminal of the eighth transistor is connected with the first node.

15. The method as claimed in claim 1, wherein the first output circuit comprises a ninth transistor and a third capacitor; and a first terminal of the ninth transistor is connected with the first signal terminal, a second terminal of the ninth transistor is connected with the output terminal, and a third terminal of the ninth transistor is connected with the first node; and a first terminal of the third capacitor is connected with the first terminal of the ninth transistor, and a second terminal of the third capacitor is connected with the third terminal of the ninth transistor.

16. The method as claimed in claim 1, wherein the second output circuit comprises a tenth transistor and a fourth capacitor;

a first terminal of the tenth transistor is connected with the second signal terminal, a second terminal of the tenth transistor is connected with the output terminal, and a third terminal of the tenth transistor is connected with the second node; and a first terminal of the fourth capacitor is connected with the third terminal of the tenth transistor, and a second terminal of the fourth capacitor is connected with the first clock signal terminal.

* * * * *